United States Patent
Vladimirov et al.

(10) Patent No.: US 9,435,052 B2
(45) Date of Patent: Sep. 6, 2016

(54) ARRANGEMENT FOR MANUFACTURING CRYSTALLINE SILICON INGOTS

(75) Inventors: Egor Vladimirov, Brevik (NO);
Alexandre Teixeira, Porsgrunn (NO);
Kai Johansen, Sanderjord (NO);
Pouria Homayonifar, Porsgrunn (NO)

(73) Assignee: REC SOLAR PTE. LTD., Singapore (SG)

(*) Notice: Subject to any disclaimer, the term of this patent is extended or adjusted under 35 U.S.C. 154(b) by 297 days.

(21) Appl. No.: 14/112,858

(22) PCT Filed: Apr. 18, 2012

(86) PCT No.: PCT/EP2012/057063
§ 371 (c)(1),
(2), (4) Date: Dec. 23, 2013

(87) PCT Pub. No.: WO2012/143385
PCT Pub. Date: Oct. 26, 2012

(65) Prior Publication Data
US 2014/0123892 A1    May 8, 2014

Related U.S. Application Data

(60) Provisional application No. 61/480,772, filed on Apr. 29, 2011.

(30) Foreign Application Priority Data

Apr. 19, 2011  (GB) .................................. 1106559.6

(51) Int. Cl.
*C30B 29/06* (2006.01)
*C30B 11/00* (2006.01)

(52) U.S. Cl.
CPC .............. *C30B 11/00* (2013.01); *C30B 11/003* (2013.01); *C30B 29/06* (2013.01); *Y10T 117/1092* (2015.01)

(58) Field of Classification Search
CPC ........................... C30B 11/002; C30B 11/003
See application file for complete search history.

(56) References Cited

U.S. PATENT DOCUMENTS

| | | | |
|---|---|---|---|
| 6,030,913 A | 2/2000 | Heine et al. | |
| 7,238,308 B2 | 7/2007 | Rosenloecher | |
| 8,317,920 B2* | 11/2012 | Kimbel | C30B 11/002 117/223 |
| 2010/0074825 A1 | 3/2010 | Kimbel et al. | |
| 2015/0090179 A1* | 4/2015 | Schmid | C30B 11/002 117/81 |

FOREIGN PATENT DOCUMENTS

| | | |
|---|---|---|
| DE | 10 2006 017 622 A1 | 10/2007 |
| EP | 0 915 070 A2 | 5/1999 |
| EP | 1 547 992 A1 | 6/2005 |
| WO | WO 2007/148985 A1 | 12/2007 |
| WO | WO 2009/014963 A1 | 1/2009 |
| WO | WO 2010/033885 A1 | 3/2010 |

\* cited by examiner

*Primary Examiner* — Robert M Kunemund
(74) *Attorney, Agent, or Firm* — Birch, Stewart, Kolasch & Birch, LLP

(57) ABSTRACT

The present invention relates to an arrangement for manufacturing crystalline silicon ingots by directional solidification, where the melt and carbonaceous structural parts of the crystallization furnace is protected from the fumes of the melt by applying a gas conduit which leads the fumes directly out of the directional solidification compartment of the furnace.

23 Claims, 14 Drawing Sheets

| 68,25 | 37,25 | 50,00 | 88,88 |
|-------|-------|-------|-------|
| 32,12 | 70,75 | 66,13 | 17,75 |
| 69,88 | 50,75 | 70,63 | 63,25 |
| 90,75 | 28,75 | 68,75 | 54,37 |

Average: 58,02 %

Figure 12

ARRANGEMENT FOR MANUFACTURING CRYSTALLINE SILICON INGOTS

CROSS REFERENCE TO RELATED APPLICATIONS

This application is the National Phase of PCT/EP2012/057063 filed on Apr. 18, 2012, which claims priority under 35 U.S.C. §119(e) to U.S. Provisional Application No. 61/480,772 filed on Apr. 29, 2011 and under 35 U.S.C. §119(a) to Patent Application No. 1106559.6 filed in the United Kingdom on Apr. 19, 2011, all of which are hereby expressly incorporated by reference into the present application.

The present invention relates to an arrangement for manufacturing of crystalline silicon ingots by directional solidification. In particular, the invention relates to a gas conduit arrangement protecting the compartment(s) of the hot zone of the furnace and preventing contamination of molten silicon through the gas phase in crystallization furnaces producing high quality crystalline silicon ingots for photovoltaic applications.

BACKGROUND

Presently, the bulk volume of the world production of photovoltaic elements comprising solar panels is based on multi-crystalline silicon wafers cut from ingots that are cast by directional solidification (DS) based on the Bridgeman method in electrically heated furnaces. The crucible being employed is usually made of silica, $SiO_2$, and the furnaces have heating elements above, below and/or sidewise with respect to the crucible to provide the heat for melting and control of heat extraction during the directional solidification. The process may be described as follows:

A crucible open at the top made of $SiO_2$ is covered in its interior with silicon nitride containing coating and filled with a silicon feedstock to a predetermined height. The crucible is then placed on the floor of the heating compartment of the furnace. Next, a circumferential support structure of graphite plates is attached along the outer crucible walls to provide mechanical support at elevated temperatures when the $SiO_2$-crucible softens and tends to sag. The furnace compartment is then closed, evacuated, and inert purge gas is supplied during the period the heating elements are engaged in melting/solidification of the silicon feedstock. When the silicon is melted, the heating is adjusted to obtain a directional solidification. An inert purge gas, usually argon, is flushed onto the surface of the silicon to protect against gaseous contamination and to remove effectively SiO-gas at least as long as the silicon is in liquid phase.

A main challenge in these processes is to maintain the purity of the molten silicon material during melting and solidification. The melt is usually protected from gaseous contaminants by a combination of evacuating the atmosphere in the hot zone of the furnace and flushing a cover of inert purge gas over the surface of the liquid silicon phase. However, the amount of purge gas may be insufficient to prevent back flows of CO generated inside the furnace chamber (due to release of SiO from the melt with subsequent contact with graphite parts of the hot zone) resulting in formation of SiC impurities in the melt. Build-up of carbon in the silicon melt leads to formation of SiC precipitates responsible for shunting effects (short circuit of pn-junctions) in solar cells leading to drastic degradation of efficiencies of photovoltaic cells. Especially high amounts of CO are generated in cases where the furnace is subject to leakages of ambient air into the interior of the hot zone. Another drawback of low purge gas flow, is that it leads to reduced evaporation of SiO from the melt, and consequently to a reduction of cell efficiencies due to light induced degradation related to higher oxygen contents in the silicon. Meanwhile, utilization of higher amounts of gas flows leads to degradation of silicon nitride coating with subsequent sticking of silicon to silica crucible walls, which causes loss of ingots due to their cracking. Thus proper and adequate control of the gas flow poses a challenge for the crystallization process of silicon for photovoltaic industry.

Silicon carbide (SiC) inclusions lead to productions losses in the downstream sawing of wafers from the blocks cut from the solidified ingots, in that the SiC-particles cause wire breakage in sawing machines and/or form saw marks on the wafers. Thus, there is a need for controlling/eliminating the intrusion of carbon and obtaining sufficient evaporation of oxygen from the silicon metal during formation of the crystalline ingots.

Further, the SiO-gas will when contacted with carbon-containing elements of the furnace react with the carbon to form CO-gas and solid SiC. The CO-gas may enter the molten silicon as described above, and the SiC will form a solid deposited phase on the surface of the carbon-containing elements being contacted by the SiO-gas. The deposition of SiC is a problem since carbon-containing structural elements of the furnace are detrimentally affected by the build-up of SiC-deposits. This is especially a problem for the graphite insulation wall of the hot zone and heating elements made of graphite. The formation of SiC-deposits changes not only the electrical properties of the heating elements requiring their frequent replacement, but also deteriorates the thermal properties of graphite insulation of the hot zone. The deterioration of carbon-containing structural elements of the hot zone of the furnace represents a substantial cost increase due to reduced service time of the furnace elements and the interruption in production associated with the maintenance work.

PRIOR ART

From WO 2007/148985, it is known device and method for production of ingots of semiconductor grade silicon, including solar grade silicon, where the presence of oxygen in the hot zone is substantially reduced or eliminated by employing materials void of oxides in the hot zone of the melting and crystallisation process. The method may be employed for any known process including for crystallising semiconductor grade silicon ingots, including solar grade silicon ingots, such as the Bridgman process, the block-casting process, and the CZ-process for growth of monocrystalline silicon crystals. The invention also relates to devices for carrying out the melting and crystallisation processes, where the materials of the hot zone are void of oxides.

DE 10 2006 017 622 discloses manufacturing multicrystalline silicon by vertical-gradient-freeze procedure, which comprises placing a lid resting upon a crucible to build a container structure, filling the container structure with silicon filling made of particulate or granular silicon up to a predetermined height, heating the container structure for melting the silicon fillings to liquid silicon, and cooling the container structure and solidifying the liquid silicon. The has an inlet and an outlet for flushing gas to isolate the interior of the container structure from the exterior atmosphere in order to avoid contamination of molten silicon with impurities of the furnace atmosphere. The lid has a contour corresponding to that of a crucible and is resting on the brackets posed on a crucible sides.

From WO 2010/033885 it is known a directional solidification furnace which includes a crucible for holding molten silicon and a lid covering the crucible and forming an enclosure over the molten silicon. The crucible also includes an inlet in the lid for introducing inert gas above the molten silicon to inhibit contamination of the molten silicon. The furnace further comprises an inlet in the lid for introducing inert gas above the molten silicon. A first gap and a second gap are disposed adjacent the lid. The first and second gaps define a nonlinear flow path for facilitating removal of contaminants from the enclosure and allowing the inert gas to exit the enclosure.

From WO 2009/014963 it is known a method and apparatus for casting silicon for photovoltaic cells and other applications able to form an ingot low in carbon and whose crystal growth is controlled to increase the cross-sectional area of seeded material during casting. The invention utilizes a lid and/or flowing of an inert gas to improve the purity of cast silicon, such as silicon having very low carbon concentrations. Lower impurities reduce the number of foreign particles included in the ingots (termed inclusions) and improve yields of the wafers and/or solar cells. An additional benefit to silicon having increased purity includes more and/or greater monocrystalline material from the same ingot. Less impurities in the silicon also allows for faster crystal growth. Additionally, a low carbon content enables a greater variety of thermal processes for turning the wafer into a solar cell.

A material known to have extreme resistance towards thermal shock and mechanical wear is ceramic composites comprising carbon fibre-reinforced silicon carbide ceramics (C—C/SiC or C/SiC composites). These materials have presently found use as friction linings in braking systems of automotive applications, in aero-space applications, as combustor chamber linings, in turbine blades, in jet engine nozzles, etc.

From U.S. Pat. No. 7,238,308 it is known that C—C/SiC or C/SiC composites may be produced by forming an intermediate body of carbon fibre-reinforced polymer (CRFP), heating the CRFP until the polymer is pyrolysed to form a porous green body of carbon fibre-reinforced carbon (C/C-body), contacting the green C/C-body with molten silicon and allow the silicon to infiltrate the green C/C-body (often termed Liquid Silicon Infiltration, LSI in the literature) such that at least some of the silicon reacts with the carbon phase of the C/C-body and forms silicon carbide, and thus providing a carbon fibre-reinforced composite ceramic having a matrix comprising SiC, Si, and C. Similar techniques and materials are known from U.S. Pat. No. 6,030,913 and EP 0 915 070.

EP 1 547 992 disclose a method for manufacturing C—C/SiC composites from a mixture of resin and carbon fibres which is pyrolysed to a green body directly without first hardening the resin. Then the green body is infiltrated with silicon to form the C—C/SiC composite. By varying the relative amounts of the ingredients, it is possible to produce composites with tailored amounts of C/C and C/SiC, and thus make composites with different thermal conductivities.

Objective of the Invention

The main objective of the invention is to provide an arrangement for manufacturing ingots of crystalline photovoltaic grade silicon which substantially reduces/eliminates the problem of carbon contamination of the silicon, and which substantially reduces consumption of purge gas and effectively protects the heating elements and hot zone of the furnace from deterioration.

The objective of the invention may be realised by the features as set forth in the description of the invention below, and/or in the appended patent claims.

DESCRIPTION OF THE INVENTION

The invention is based on the realisation that a more operationally flexible and applicable solution for shielding the melt and carbonaceous elements of the furnace from detrimental action of SiO-fumes in industrial production lines, is obtained by forming a gas conduit which simultaneously protects the silicon melt from gas contamination and prevents deterioration of the hot zone caused by SiO-gas evaporating from the silicon melt in such a manner that SiO-gas is unable to contact chemically sensitive parts.

Thus, the present invention relates to an arrangement for manufacturing crystalline silicon ingots by directional solidification, where
  the arrangement comprises at least one compartment with heat insulating side wall(s) able to house a crucible, and
  where the compartment comprises:
    i) heating means,
    ii) at least one inlet for supplying purge gas into the compartment, and
    iii) one or more outlet(s) for extracting gas from the compartment,
characterized in that the compartment further comprises:
  a gas conduit formed by a continuous peripheral opening between:
    an upper shield element placed at a distance above the crucible and which covers the horizontal cross-section area of the compartment to separate it in two overlaid sub-compartments where the upper sub-compartment has heating means, and
    a lower shield element placed at a distance below the upper shield element and along the outer surface of the crucible, and which covers the cross-section area formed between the outer surface of the crucible and the inner surface of the side heat insulating wall(s) of the compartment,
  a flow constriction located in the gas conduit or the one or more outlet(s) providing a cross-section area, A, in the gas conduit or one or more outlet(s) where $A = P \cdot d$, P is the perimeter length of the crucible in mm and d is between 0.5 and 50 mm, and where
  the one or more inlet(s) for supplying purge gas is (are) located above the crucible, and
  the one or more outlet(s) for extracting gas is (are) located on the heat insulating side wall(s) of the compartment between the upper and lower shield elements.

The term "compartment" as used herein means a defined zone of the furnace where the heating, melting and solidification of the silicon in one crucible are taking place. The compartment is having thermally insulating walls to obtain a homogeneous directional temperature gradient in the compartment, but may also have a heat insulating floor and ceiling. In furnaces for making multi-crystalline ingots, the compartment is usually a rectangular compartment with heat insulating walls, floor and ceiling, and in furnaces for making mono-crystalline silicon the compartment is often shaped as an open cylinder of heat insulating material. Other geometries may also be applied. The furnace may contain more than one compartment to be able to produce more than one ingot in each run. The zone of the furnace comprising the directional solidification compartment(s) is the hot area of the furnace and is thus often denoted the hot zone. The furnace will often have an outer steel shell or other type of mechanically rigid and gas-tight structure enclosing the hot zone to be able to form vacuum and/or a protected atmosphere in the hot zone.

The compartments in the hot zone needs some form of heating means in order to perform the melting and solidification required to make crystalline silicon ingots. The invention may apply any known or conceivable heating means for melting and directionally solidifying the silicon in the crucible. A suited example of heating means is electric resistance heaters which may be placed in the bottom, the upper part, on the sides, or in any combination of these locations in the compartments of the hot zone.

The compartment may advantageously have a bottom support structure made of graphite or another heat conductive and mechanically rigid material for carrying the crucible and/or other structures/devises in the compartment. One suited example of bottom support structure is a horizontally oriented partition wall or floor covering the entire cross-section area of the compartment and thus dividing the lower part of the compartment into two chambers; one upper chamber where the crucible is to be placed and one lower chamber suitable to contain heating means for heating the crucible from below. However, the present invention may apply any known or conceivable load carrying support structure for carrying the crucible, also including furnaces with no bottom support structure in the compartment(s) of the hot zone. In the latter case the crucible is placed directly onto the bottom heat insulating wall (floor) of each compartment in the furnace.

The compartment may advantageously also comprise a circumferential support structure in the form of i.e. rectangular plates of graphite or another heat resistant mechanically rigid material that is placed or mounted alongside the outer walls of the crucible to provide mechanical strength at elevated temperatures when the crucible sags. However, the circumferential support structure may be any known or conceivable structure able to provide mechanical support to the crucible such as i.e. a protruding section of the crucible, arms extending from the heat insulating walls of the compartment etc. The circumferential support structure may also function as a load carrying structure or suspension point for structural parts in the compartment. The term "circumferential" as used herein means that the structure, i.e. the support structure surrounds the outer walls of the crucible to form a continuous structure extending along the entire periphery of the crucible. The circumferential support structure may be in contact with the crucible wall, or it may be at a distance from the crucible wall.

The term "gas conduit" as used herein means the free space in the compartment formed between the upper shield element and the lower shield element which are placed above each other such that they define a continuous peripheral opening surrounding the crucible. The main function of the gas conduit is to protect the silicon melt and structural parts of the compartment from deteriorative contact with the fumes exiting the melt by forming a flow channel leading the fumes directly out of the compartment. The upper and lower shield element may advantageously avoid any contact between each other to form a continuous flow channel. The gas conduit may advantageously include a gas trap located outside the compartment to enhance the protective effect of the gas conduit.

The effect of the gas conduit is obtained by employing an upper gas barrier surface preventing the fumes from the melt to flow into the upper section of the compartment and a lower gas barrier surface preventing the fumes from flowing into the lower section of the compartment combined with a flow constriction of the flow channel preventing the gas from flowing back.

Thus the term "upper shield element" as used herein means any form of physical structure located in the compartment which is able to form a continuous and substantially impenetrable gas barrier surface inside the compartment forming an upper closure of the compartment (by covering the horizontal cross-section area of the compartment). The upper shield element may advantageously be a substantially horizontally oriented partition wall or ceiling dividing the upper compartment into two horizontally separated overlaid sub-compartments: the lower becoming the sub-compartment housing the crucible. This provision has the advantage of forming an upper sub-compartment protected against the deteriorative fumes from the melt and which is suited for locating top heating means (such as i.e. heating elements) for heating the crucible from above. The upper shield element may i.e. be a rigid plate of a material, or a flexible sheet of a material able to withstand the temperatures and chemical environment found in silicon crystallisation furnaces formed by one continuous structural element, or it may be composed of several elements which together covers the intended cross-sectional area of the inner space of the compartment.

The compartment may also include a conventional top shield, which is an upper substantially horizontally oriented partition wall or ceiling dividing the upper compartment of the hot-zone into two horizontally separated chambers. In case of applying a top shield, the upper shield element may be a coating, sheet or plate material attached to the lower surface of the top shield facing the one or more crucibles. In this case, the top shield is integral with the gas conduit forming the upper part of the gas conduit.

The term "lower shield element" as used herein means any form of physical structure located in the compartment which is able to form a continuous and practically impenetrable gas barrier surface inside the compartment forming a lower closure of the compartment between the crucible and heat insulating side wall(s) (by covering the horizontal cross-section area of the compartment between the crucible wall and the heat insulating wall along the entire periphery of the crucible). That is the lower shield element forms a circumferential substantially horizontally oriented partition wall or platform projecting from the outer wall of the crucible along the entire periphery of the crucible and thus separating the inner space of the compartment into two over-laid sub-compartments along the periphery of the compartment, the upper sub-compartment being the gas conduit and the lower sub-compartment being a circumferential chamber on the sides of the crucible and which is protected against the deteriorative fumes from the melt. The circumferential chamber is suitable for housing side heating means for heating the crucible from the side(s). The lower shield element should surround the outer wall of the crucible with a maximum clearance of a few millimeters, i.e. from 1 to 10 mm, in order to form an effective gas barrier preventing the gas from flowing into the side chamber. In case a circumferential support structure is applied, the lower shield element may simply be resting on the circumferential support structure, or made to be an integral part of the circumferential support structure by being attached or fastened to the circumferential support structure. The dimensioning and/or positioning of the circumferential support structure may advantageously be such that when the lower shield element is laid onto or attached to the upper face of the support structure, the upper surface of the lower shield element may advantageously be positioned at a level in the range of 10 to 100 mm above (or below) the upper edge of the crucible wall (measured at standard conditions, STP) or above (or below) the upper edge of the supporting side plates. The lower shield element may i.e. be a rigid plate of a material, or a flexible sheet of a material able to withstand the temperatures and chemical environment found in silicon crystallisation furnaces formed by one continuous structural element, or it may be composed of several elements which together covers the intended cross-sectional area of the inner space of the compartment.

The gas conduit leads the purge gas mixed with fumes (such as SiO) directly from the space above the melt to the area beyond the compartment (e.g. interstitial space between the compartment and steel vessel encompassing the hot zone). The upper and lower shield elements sheets defining the gas conduit should preferably have gas tight walls to avoid exposing any carbon-containing parts (insulation, lining etc.) of the hot zone of the furnace to the SiO-containing gases. However, this is not mandatory since the suction effect formed by the gas outlet, depending on the speed of the gas flow and pressure inside the gas conduit, will make the gas conduit act as suction tube according to the Bernoulli principle. Thus, the gases of the interior atmosphere of the compartment will tend to be sucked from the compartment space outside the gas conduit allowing having a certain degree of openings in the shield elements or non-tight fittings between the shield elements and walls of the compartment, crucible etc. Such suction forms preferable direction for the otherwise stagnant gas atmosphere inside the compartment avoiding destructive contact of SiO-gas with the heat insulating material of the compartment. The gas path formed by the gas conduit may advantageously be the shortest possible, thus requiring that the upper and lower parts of the gas conduit (namely, upper and lower shield element) are perpendicularly oriented with respect to the crucible walls and the heat insulating wall(s), but not necessarily.

The term "flow constriction" as used herein means any form of narrowing of the vertical cross-section area of the free space at least at one location in the in the gas conduit. The main function of the flow constriction is to form a back-flow restriction barrier preventing gaseous impurities and used purge gas from flowing back and contacting with the silicon melt surface by ensuring domination of the purge gas flow over the back-flow diffusion of the ambient atmosphere. That is, the minimum requirement to obtain this back-flow barrier is to form at least one section in the gas conduit with sufficiently low cross-sectional area to cause the gas to pass with a flow velocity higher than the diffusion velocity of impurity compounds in the gas. The size of the cross-sectional area of the gas conduit required to obtain this feature is depending on the purge gas volume flow being applied. In practice, the applied amount of purge gas being applied means that the flow constriction should define a cross-section area, A, in the gas conduit of $A=P \cdot d$, where P is the perimeter length of the crucible in mm and d is either between 0.5 and 50 mm, between 2 and 10 mm, or between 4 and 6 mm. The flow constriction may alternatively be placed in the one or more outlets for extracting gas from the compartment.

The flow constriction may be formed by having any structural element in the gas conduit which forms the required narrowing of the flow volume of the gas conduit. One convenient way of obtaining the flow constrictions is to apply a crucible with a height making the crucible walls protruding up to partly blocking the flow channel in the gas conduit. This principle is illustrated schematically in FIGS. 1 and 2, which are schematic drawings of the cross-section of the invention according to the first aspect as seen from the side and from above, respectively.

FIG. 1 shows a silicon melt 1 in a crucible 2 placed in a rectangular compartment defined by an upper, lower and side heat insulating walls 3. The crucible 2 is placed onto a floor 4 of graphite functioning as a bottom support structure carrying the crucible, and which divides the inner compartment into one bottom chamber 5 and one mid chamber housing the crucible 2. The purge gas is inserted through inlet 13 and is flushed over the upper surface of the silicon as indicated by the arrows below the gas inlet. Above the crucible 2 there is an upper shield element 19 forming the upper part of the gas conduit and separating the mid chamber further into an upper chamber 11 and the chamber housing the crucible. On the sides of the crucible, there is provided a lower shield element 15 extending from the outer surface of the crucible 2 to the inner surface of the side heat insulating wall 3, and thus dividing the mid-chamber further into a side chamber 7 and the gas conduit. A gas outlet 14 is located in the heat insulating side wall 3 between the upper and lower shield element 15, 19. The gas constriction 10 is formed by the narrowing of the gas conduit due to the height of the crucible defining a separating distance d between the upper edge of the crucible 2 and the upper shield element 19. FIG. 2 shows the same embodiment as seen from above along the dotted line running from B to B' in FIG. 1.

The figure shows that the lower shield element 15 is forming a circumferential "shelf" closing the space between the crucible 2 and the heat insulating walls 3.

Alternatively, the gas constriction may be formed by having a circumferential side support structure around the crucible which extends sufficiently high to define the separating distance d between the upper edge of the circumferential side support and the upper shield element. In this case, the lower shield element is dimensioned to extend from the outer surface of the circumferential side support to the heat insulating wall.

A further alternative is to form the gas constriction in the gas outlet. In this case the lower shield element may simply be resting on the upper edge of the circumferential side support or the crucible as described above.

Still another alternative to form the gas constriction is to apply a "hood" in the form of a gas tight structure attached to the upper shield element. The hood may be given any conceivable shape and dimensioning as long as it forms an upper enclosure of the crucible extending from the upper shield element to define a distance d between the lower edge of the hood and the lower shield element, and which is located at a horizontal distance apart from the crucible such that purge gas will be allowed to flow between the crucible and the inner surface of the hood towards the slot or opening that is being made between the hood and the lower shield element. The slot or opening should advantageously extend all way around the crucible; there should preferably be no contact between the hood and the crucible and lower shield element at any point. The minimum distance between the crucible wall and the hood should be from 10 to 100 mm. The minimum distance between the crucible wall and the lower edge of the hood should be at least 35-50 mm. This feature provides the advantage of forming a longer flow path for the purge gas inside the gas shield towards the circumferential slot formed between the hood and the lower shield element, and thus eliminate the occurrence of back-flow zones.

The hood may for instance be made by joining together four planar trapezoidal sheets of a heat conductive, preferably chemically resistant and rigid material to form an "umbrella" resembling structure which is suspended from the top shield of the hot-zone of the furnace. Other embodiments of the hood may also be employed. The hood may advantageously be tapered outwardly to form a shape resembling a truncated pyramid suspended from the top shield with an angle, related to the surface of the top shield, in one of the following ranges: from 30° to 75°, from 45° to 70°, or from 55° to 65°. The feature of having an outwardly tapered hood that encompasses the top section of the crucible and forms a circumferential gap together with the lower shield element a distance below and outside of the upper edge of the crucible, is that this structure defines an open volume (gas pocket) between the slot and the crucible which allows to accommodate small accidental backflow of the purge gas without exposing the entire liquid silicon under the hood. This feature is suitable for the furnaces with intermittent operation of the vacuum pump since there are often formed small fluctuations of the pressure (below 1-2 mbar) and thus resulting in short fluctuating deviations of the purge gas flow in the vicinity of the gap.

The feature of having a hood which is integrated with the upper shield element and which extends down towards the lower shield element provides the advantage of avoiding physical contact between the crucible and the hood of the gas shield, and thus elimination of any damages of the construction resulting from operations (loading/unloading of crucibles into furnace, closing/opening the furnace), which necessarily requires the existence of clearance to preserve the desired width of circumferential slot for the purge gas coming out. Furthermore, in a particular case of the silica crucible, the slot realized below and beyond the periphery of the crucible alleviates the chemical wear of the release coating of the crucible (thus avoiding loss of ingots due to coating destruction resulting in sticking of silicon to silica walls with subsequent cracking of ingots) by purge gas by means of reducing the exposure of the coating to the high flow velocities in the vicinity of the circumferential slot.

The heat insulating wall may also be attacked by the fumes from the melt, such that the gas conduit may advantageously include a protection of the inner surface of the heat insulating walls of the compartment and the surface of the one or more gas outlets being exposed to the fumes from the melt. This protection may be obtained by covering the exposed surfaces with a material which is able to withstand the heat and chemical environment, either separately of the gas conduit or as an integral part of the gas conduit. An example of the latter is by having a gas outlet forming a continuous slot in the heat insulation along the entire periphery and having the lower shield element extending from the crucible or the circumferential side support and out through the gas outlet. The upper shield element may likewise extend out through the gas outlet.

In addition the arrangement according to the invention may comprise a trap for SiO. The term "trap" for SiO condensation as used herein, means a cold body, preferably made of metal of arbitrary geometry, but possessing relatively high surface area and suspended from the outer vessel in front of the outlet of gas conduit. Due to low thermal capacity of the gases coming through the conduit, cooling for the metal trap may be advantageous depending on furnace design. Abrupt drop of the temperature from nearly 1500° C. to ca. 300-400° C. at the outlet of the gas conduit necessary leads to condensation of SiO-gas forming amorphous silica in a form of sponge at the surface of the metal body. Thus, the purge gas passing through the trap will lead to SiO condensation resulting in a cleaner ambient atmosphere, and thus alleviating the deteriorative effect on graphite containing parts of the back-diffusion through the insulation walls of the compartment into the high temperature area.

The main advantage of the gas conduit in combination with the gas trap described above is the protection of graphite parts of the compartment from deterioration by SiO-gas purged out from the melt with simultaneous protection of the silicon melt from the contamination through the gas phase. A further advantage is that the arrangement according to the invention reduces consumption of purge gas by a factor of 4-5 as compared to similar arrangements without the gas conduit.

Material Consideration

The gas conduit should be made of a material which is able to withstand the high temperatures associated with the melting of silicon without decomposing or in other way releasing (by gassing, perspiration, flaking, etc.) contaminating compounds. The material should also withstand the temperatures without loss of its desired mechanical rigidity. Further, the gas conduit material preferably should be chemically inert in the chemical environment encountered in crystallisation furnaces for manufacturing mono- and multicrystalline silicon ingots.

Another consideration that advantageously may be taken into account is that the temperature profile and heat fluxes inside the compartment of the furnace should not be detrimentally affected by the introduction of the gas-conduit in order to preserve the intended heat extraction rates and control of the directional solidification process. That is, the heat resistance across the gas-conduit should not hinder heat extraction through the bottom of the crucible. Thus, in summary, the gas-conduit should be made of a material with sufficient mechanical rigidity to form a rigid gas-conduit with a plate thickness in the range of 1-20 mm, and which optionally has a thermal conductivity of at least 1 W/mK or higher.

The gas conduit may advantageously be made by joining sheets of the heat resistant and chemically inert material to form a channel leading the fumes from the melt and the purge gas from the space above the crucible to the outlet for evacuating gas from the hot zone. The sheets should preferable be joined together such that the channel has substantially gas tight walls to avoid exposing any carbon-containing surface of the hot zone of the furnace to the SiO-containing gases. That is, the walls of the gas conduit should preferably be made of a continuous layer of a heat resistant and chemically inert material which transports the SiO-containing gas out of the hot zone such that any possible contact between elementary carbon and SiO inside the hot zone is prevented.

Examples of suitable materials for use in the gas-conduit includes, but is not limited to, ceramic materials with a SiC-coating, such as i.e. carbon fibre-reinforced carbon (known as CFRC, C/C, CFC etc) with a SiC-coating, graphite coated with SiC, silicon carbide ceramics (C—C/SiC or C/SiC composites), silicon carbide fibre composite (SiC/SiC). These materials will have sufficient thermal conductivity, the necessary mechanical rigidity to allow forming the upper and lower shield elements with a sheet thickness in the range of 1-10 mm, preferably 2-8 mm, 2-5 mm or 2-3 mm.

The SiC-coating may be applied on the inner side and optionally on the outer side of the sheets to form a coating with a thickness in the range of 10-200 μm, preferably 20-150 μm, 40-120 μm, or 60-100 μm. The CFRC may advantageously be given a coating of SiC with thickness from about 10 to about 200 μm SiC on one or both sides of the CFRC in order to make the gas conduit more chemically inert towards the compounds of the gases in the compartment. Both upper and lower shield elements may be made of sheet materials of CFRC with a SiC-coating.

The invention may apply any known or conceivable crucible for production of crystalline silicon by directional solidification. Examples of crucibles include one of: silicon carbide, silicon nitride coated crucibles of quartz, reaction bonded silicon nitride, C—C/SiC, etc. The arrangement according to the invention is not tied to Bridgeman type furnaces or processes, but may be applied for any known or conceivable process for forming mono- or multi-crystalline silicon ingots.

LIST OF FIGURES

FIG. 7a) and b) is a schematic drawing of the hood according to the invention seen from below and from the side, respectively.

Figure 8:
Figure 8:

FIG. 8a) is a photograph of a multicrystalline silicon ingot manufactured according to the present invention, and b) is a photograph of a multicrystalline silicon ingot manufactured without use of the gas shield.

Figure 9:
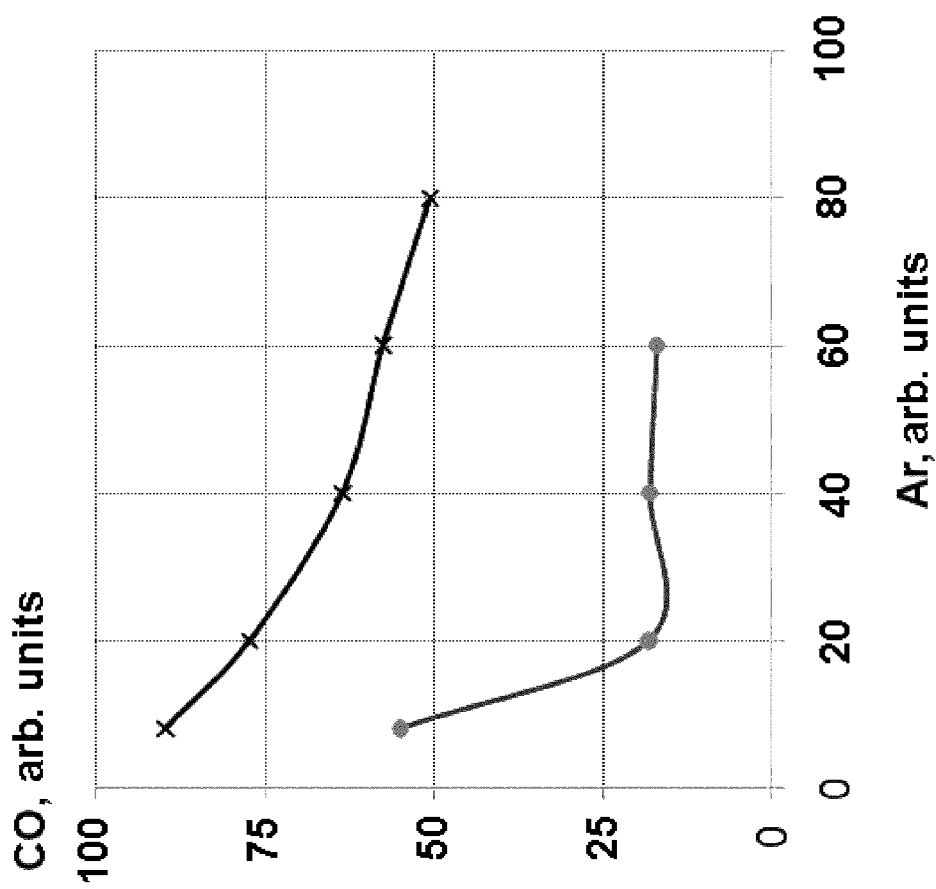

FIG. 9 is a curve diagram showing reduction of CO concentration (arb. units) above silicon melt as a function of Ar flow (arb. units) for prior art gas supply (black line, crosses) as compared with gas supply according to the present invention (black line, circles).

Figure 10:
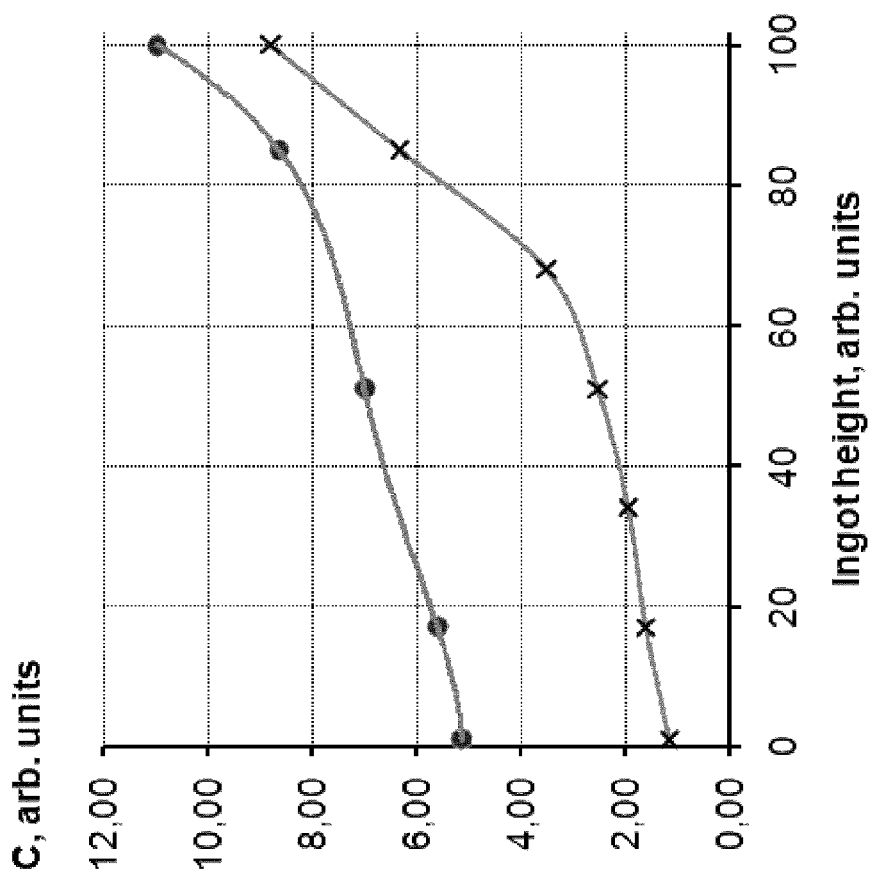

FIG. 10 is a curve diagram showing the carbon concentration (arb. units) as a function of ingot height (arb. units) as found by SIMS analysis. The results for ingots made without gas conduit is the black line with circles, while the results for the ingots made with the gas conduit of the present invention is the black line with crosses.

Figure 11:
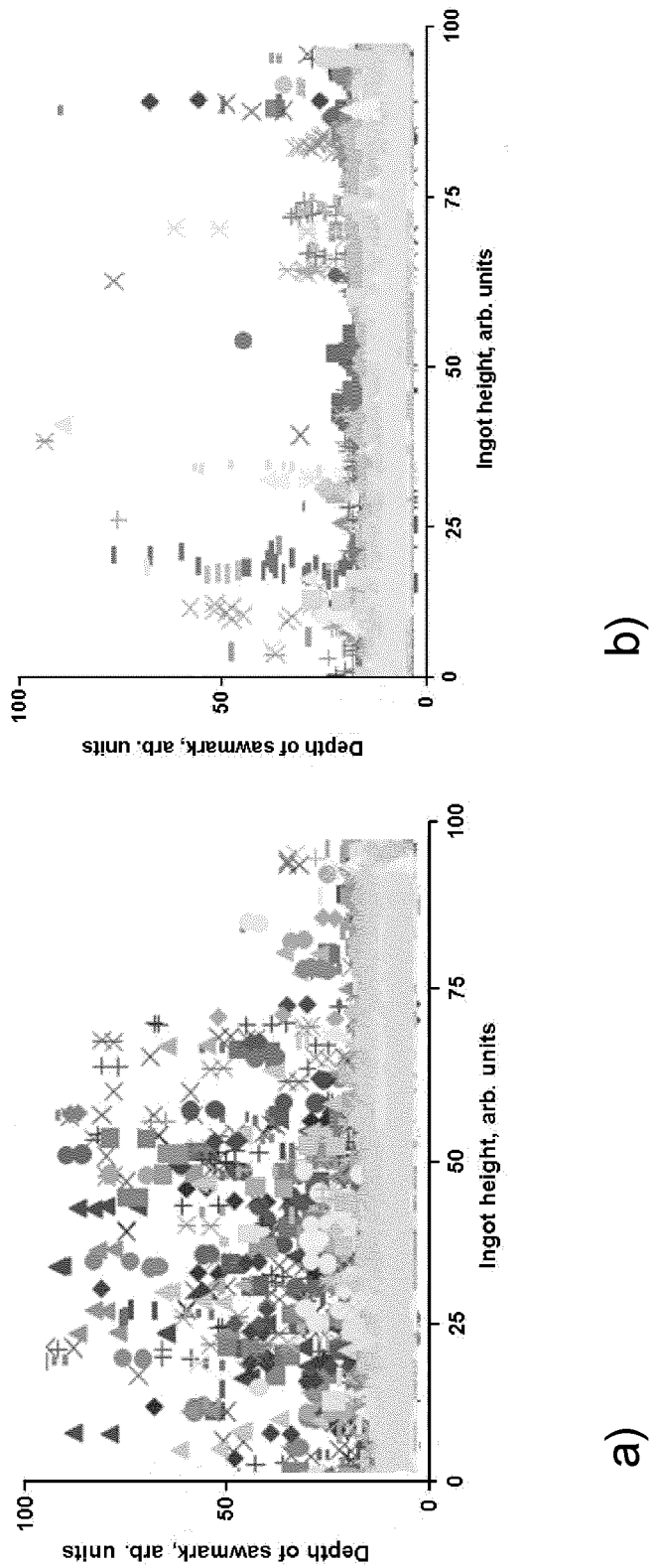

FIG. 11a) is a diagram summarising sawing mark depth for wafering process as a function of ingot height for ingots made without the gas conduit, and 11b) is a diagram summarising sawing mark depth for wafering process as a function of ingot height for ingots made with the gas conduit according to the present invention.

FIG. 12 is a diagram indicating the 16 blocks being cut from one ingot with a typical distribution of reduced losses (in %) in the wafer production line obtained compared to prior art manufacturing without gas conduit.

Figure 13:
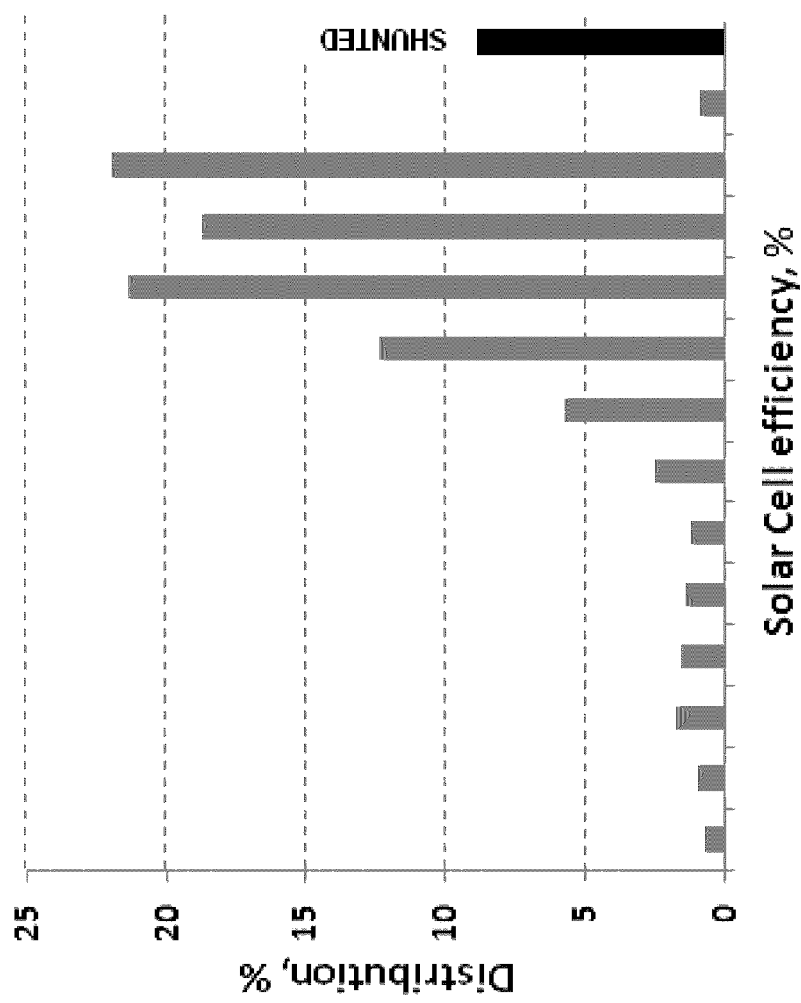

FIG. 13 is a diagram showing the cell efficiency distribution of solar cells produced from mono crystalline silicon ingot, which was crystallized in a vertical gradient freeze furnace according to prior art baseline manufacturing without employing the gas guiding device according to the invention.

Figure 14:
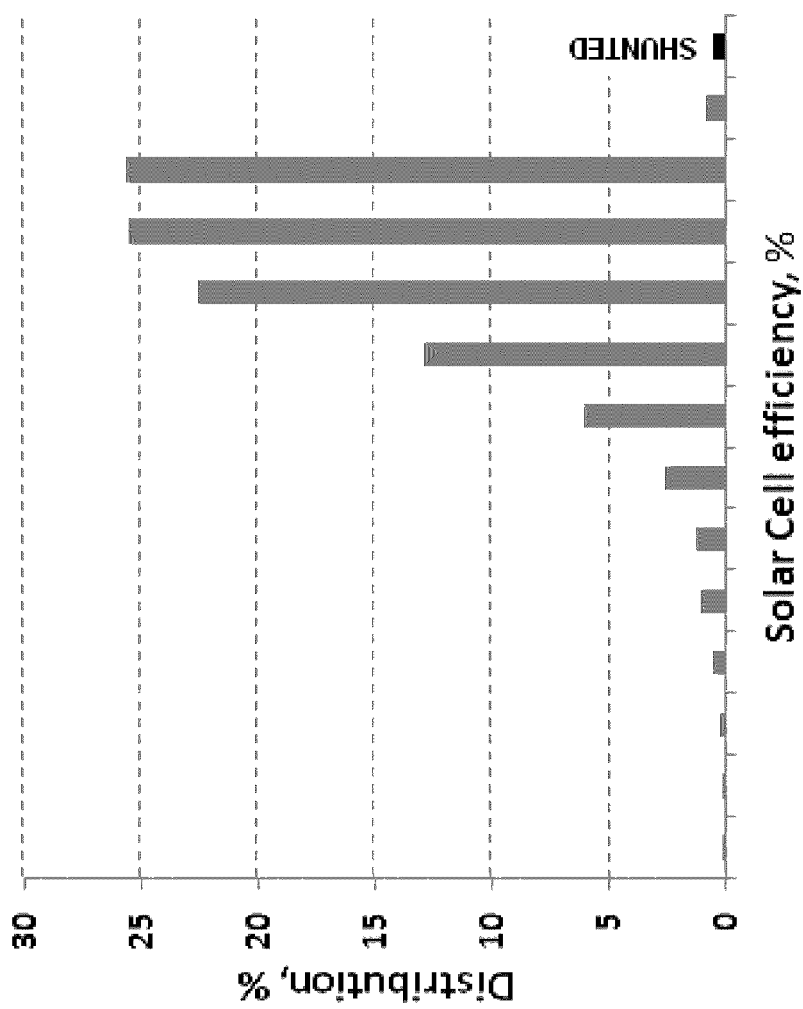

FIG. 14 is a diagram showing the cell efficiency distribution of solar cells produced from mono crystalline silicon ingot, which was crystallized in a vertical gradient freeze furnace employing the gas guiding device according to the present invention.

EXAMPLE EMBODIMENTS OF THE INVENTION

The invention will now be described in greater detail by way of example embodiments. These example embodiments should not be interpreted as a limitation of the general inventive idea of employing a gas conduit to lead the fumes out of the compartment without making contact between the gas and elementary carbon, and thus prevent the detrimental effect of the fumes on the melt and material integrity of the carbonaceous elements of the furnace.

First Example Embodiment

Figure 1:
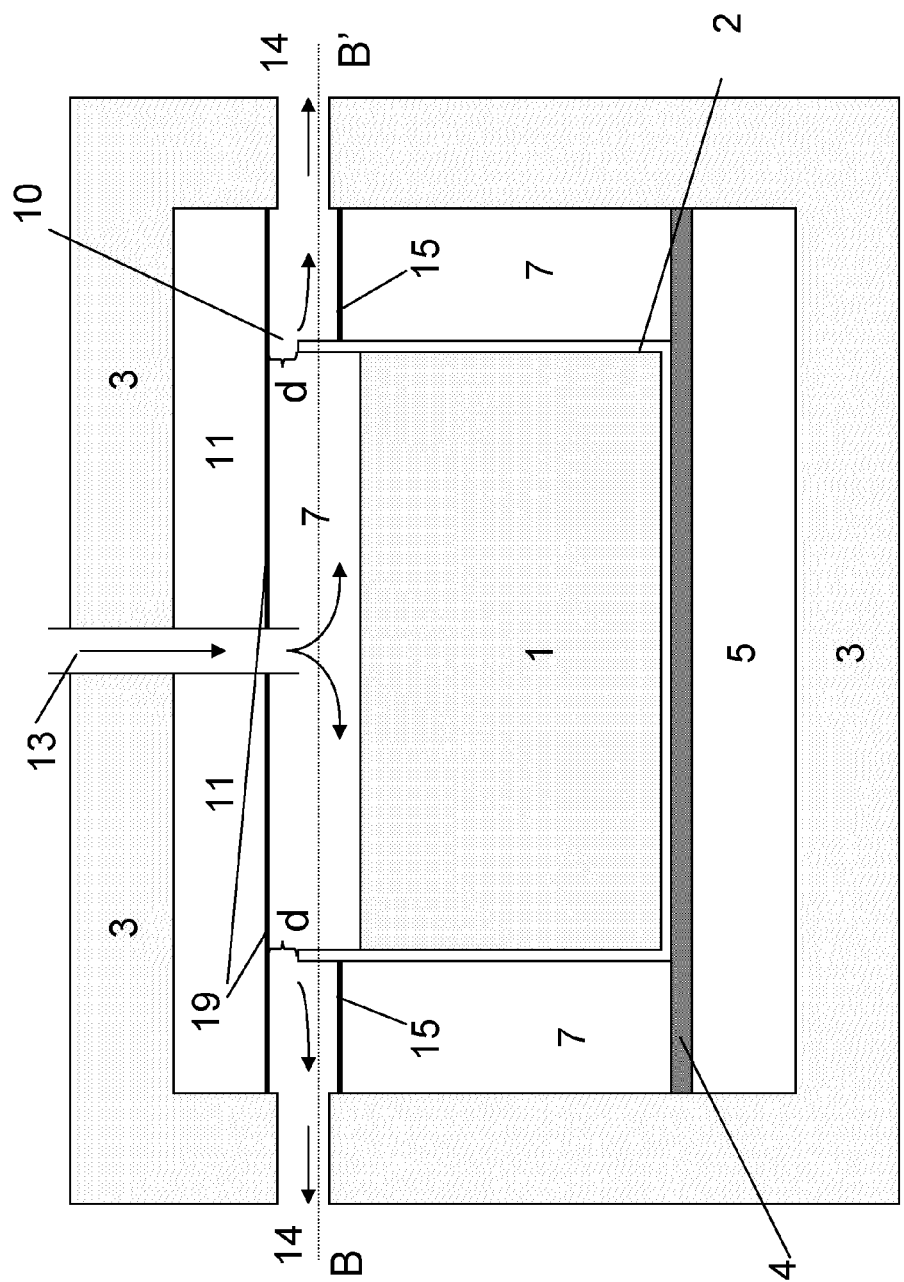
FIG. 1 is a schematic drawing of a cross-section of the arrangement according to the first aspect of the present invention as seen from the side.
Figure 2:
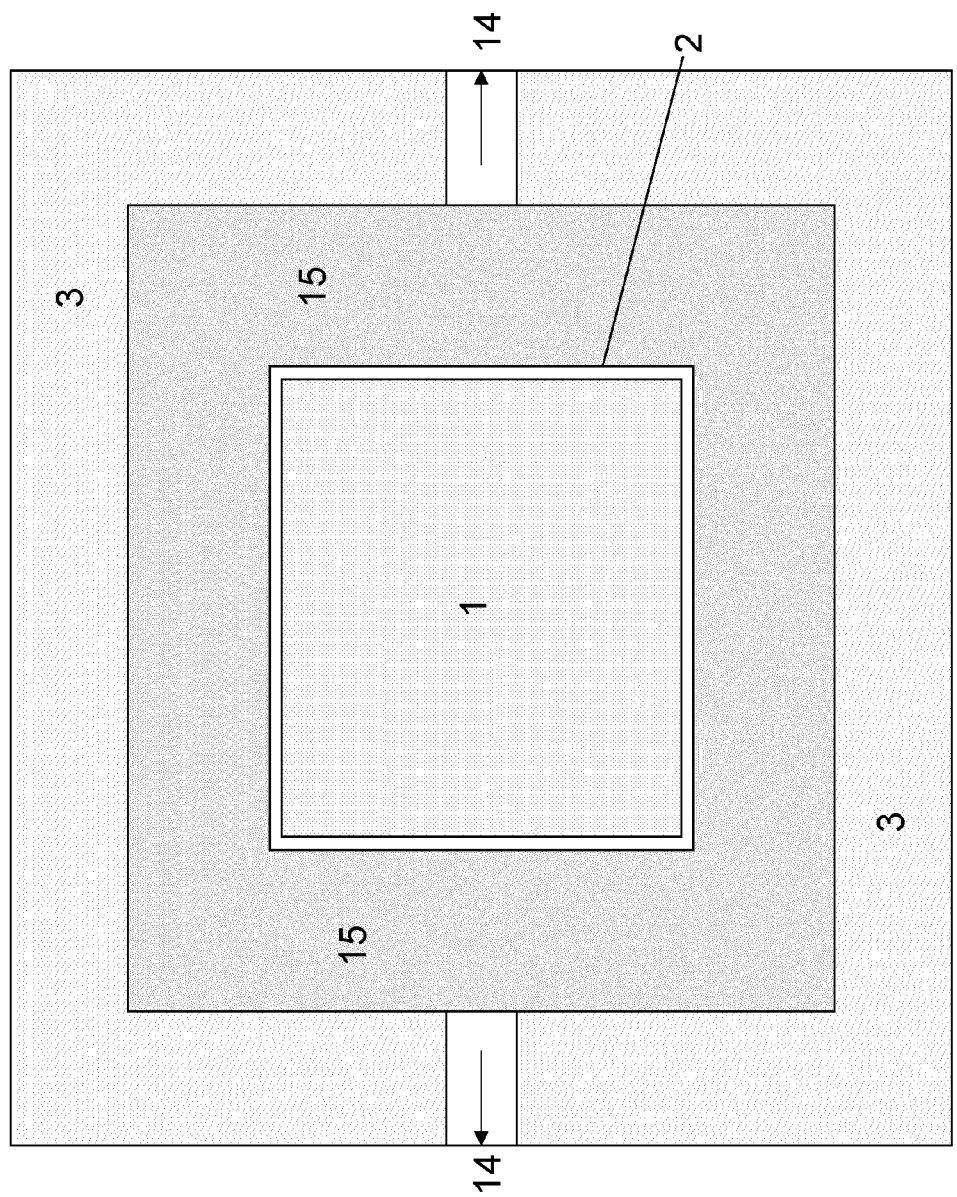
FIG. 2 is a schematic drawing of the cross-section from above along the dotted line from B to B' shown in FIG. 1.
Figure 3:
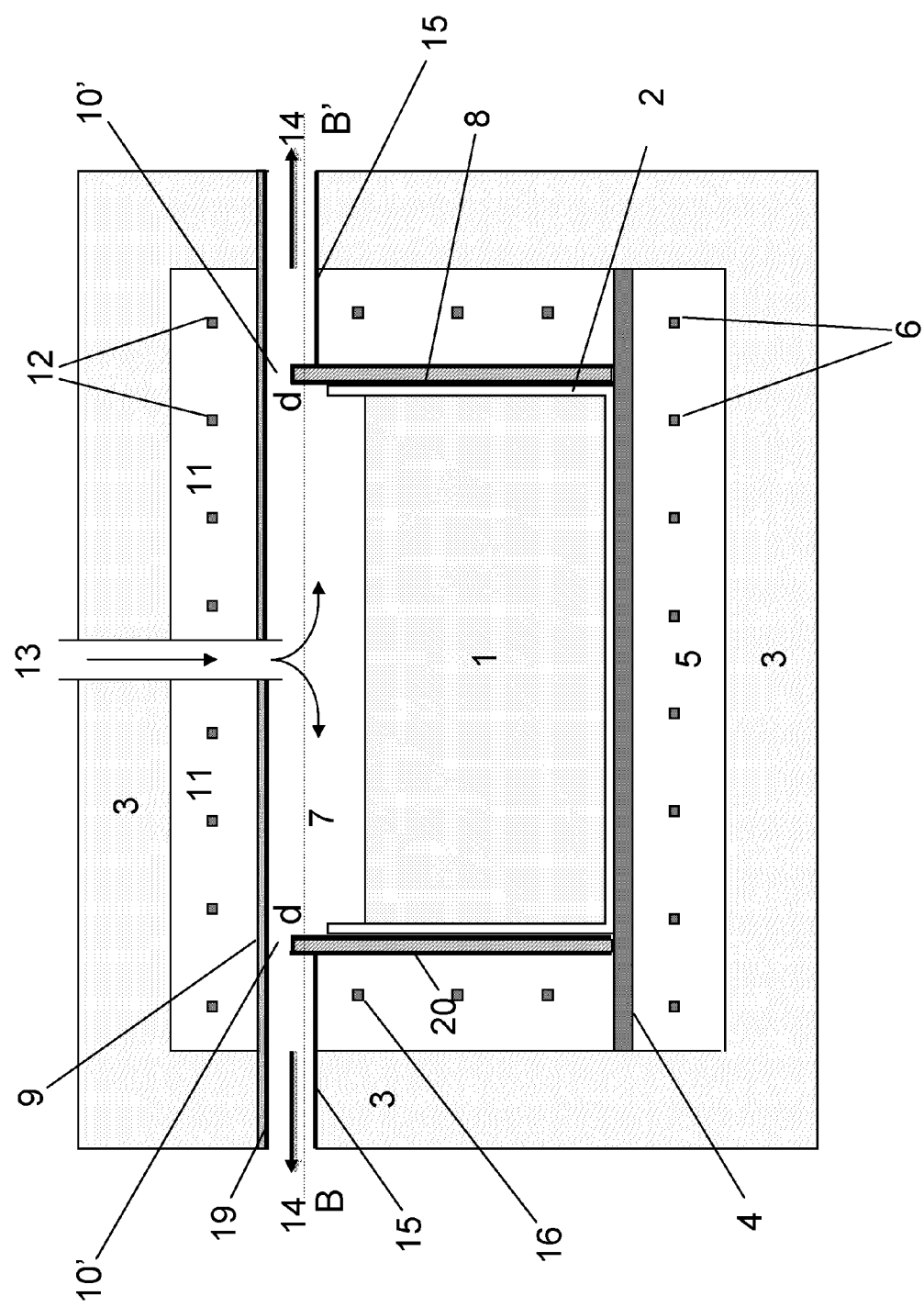
FIG. 3 is a schematic drawing of a cross-section seen from the side of a first example embodiment of the invention.

The example embodiment, shown in FIG. 3, comprises an inner furnace space or compartment for performing melting and solidification of silicon 1 in a crucible 2 by the Bridgeman method. The compartment is the space confined by the heat insulating walls 3. The crucible is a conventional silica crucible coated with a slip coating of silicon nitride.

Figure 4:
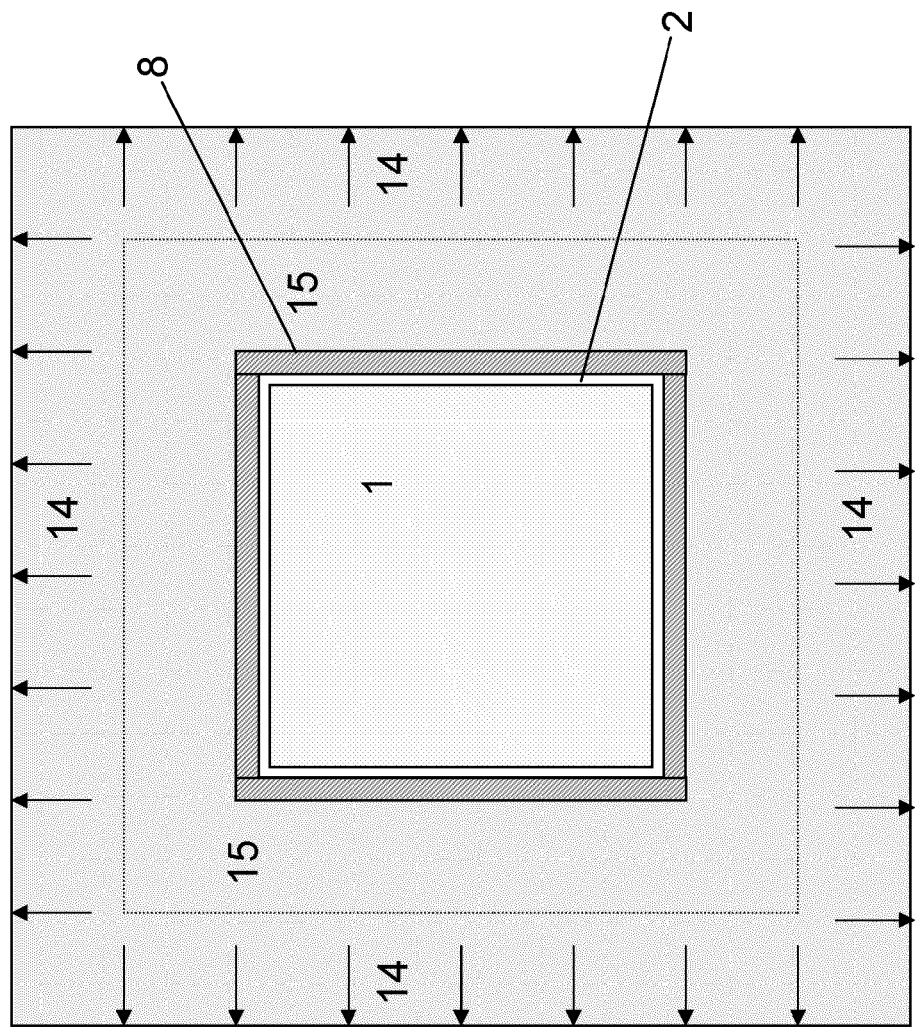
FIG. 4 is a schematic drawing of the cross-section from above along the dotted line from B to B' shown in FIG. 3.

The crucible 2 is placed onto a floor 4 of insulating graphite which divides the inner compartment into one bottom chamber 5 housing electric resistance heaters 6 made of graphite for heating the crucible from below and one mid chamber 7 housing the crucible 2. The sides of the crucible are mechanically supported by plates of graphite 8. Above the crucible 2, the hot zone is equipped with a top shield in the form of a horizontal partition wall dividing the compartment of the hot zone further to form one upper chamber 11 housing electric resistance heaters 12 made of graphite for heating the crucible from above. Purge gas is supplied to the hot zone via inlet 13 and extracted together with the fumes from the melt via gas outlet 14, which is connected to a pump (not shown) for establishing vacuum conditions. The gas outlet 14 is made into a continuous slot running along the entire periphery of the heat insulating walls 3, as illustrated on FIG. 4 which shows the cross-sectional area as seen from above taken along the line from B to B' in FIG. 3. The dotted line on FIG. 4 illustrates the inner surface of the heat insulating walls 3 below the lower shield element which extends out of the compartment and includes the surface area of the heat insulating walls 3.

The gas conduit is formed by sheet elements 15, 19 of carbon fibre-reinforced carbon (CFRC) of thickness 3-4 mm and which on the side facing the interior of the gas conduit is coated with 80-100 μm thick layer of SiC to form a continuous cover of all carbonaceous elements of the hot zone which may come in contact with the fumes from the melt. The thermal conductivity of the SiC-coated CFRC is about 25 W/mK at 1600° C. In this example embodiment, the upper shield element of the gas conduit is made up of one plate element 19 of SiC-coated CFRC covering the horizontal partition wall 9. The lower shield element 15 is made of the same material as the upper shield element 19. Note the shield elements 15 and 19 extend all the way to the outer surface of the heat insulating walls 3 such that they also protects the surface of the gas outlet 14 from being contacted with the fumes from the melt.

The gas constriction 10' is formed by the gap between the upper edge of the circumferential support structure 8 and the upper shield element 19. In order to protect the graphite plates of the circumferential support structure 8 from the fumes from the melt, the graphite plates are covered with similar SiC-coated CFRC sheet elements 20 as the gas conduit. The sheet elements 15 and 20 should preferably be joined together to form gas tight junctions between them. In this example embodiment the gas conduit is defined by the entire free space of the mid chamber 7.

Second Example Embodiment

Figure 5:
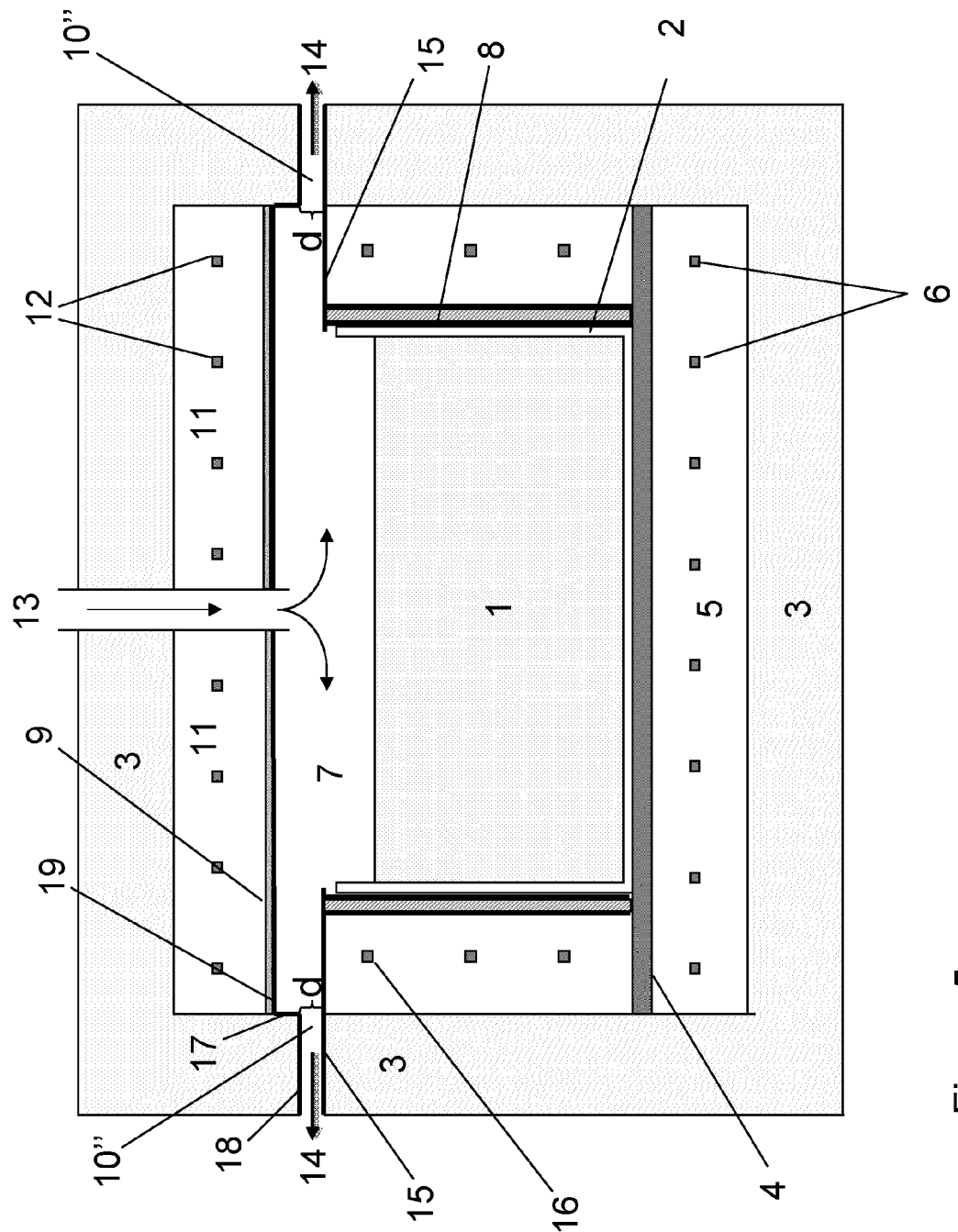
FIG. 5 is a schematic drawing of a cross-section seen from the side of a second example embodiment of the invention.

The second example embodiment is shown schematically in FIG. 5. This example embodiment is similar to the first example embodiment above except that the height of gas outlet 14 and the circumferential side support 8 is aligned to allow the lower shield element 15 to rest upon the upper edge of the side support 8 and extend out of the gas outlet 14, and that the upper surface of the gas outlet 14 is lowered such that the gas constriction 10" is formed by the gas outlet 14. This makes it necessary to cover the upper surface of the gas outlet by a similar sheet element 18 and a section of the inner surface of the heat insulating wall by plate element 17. The plate elements 17, 18, and 19 should preferably be joined together to form gas tight junctions between them. In this example embodiment the gas conduit is defined by the entire free space of the mid chamber 7.

Third Example Embodiment

Figure 6:
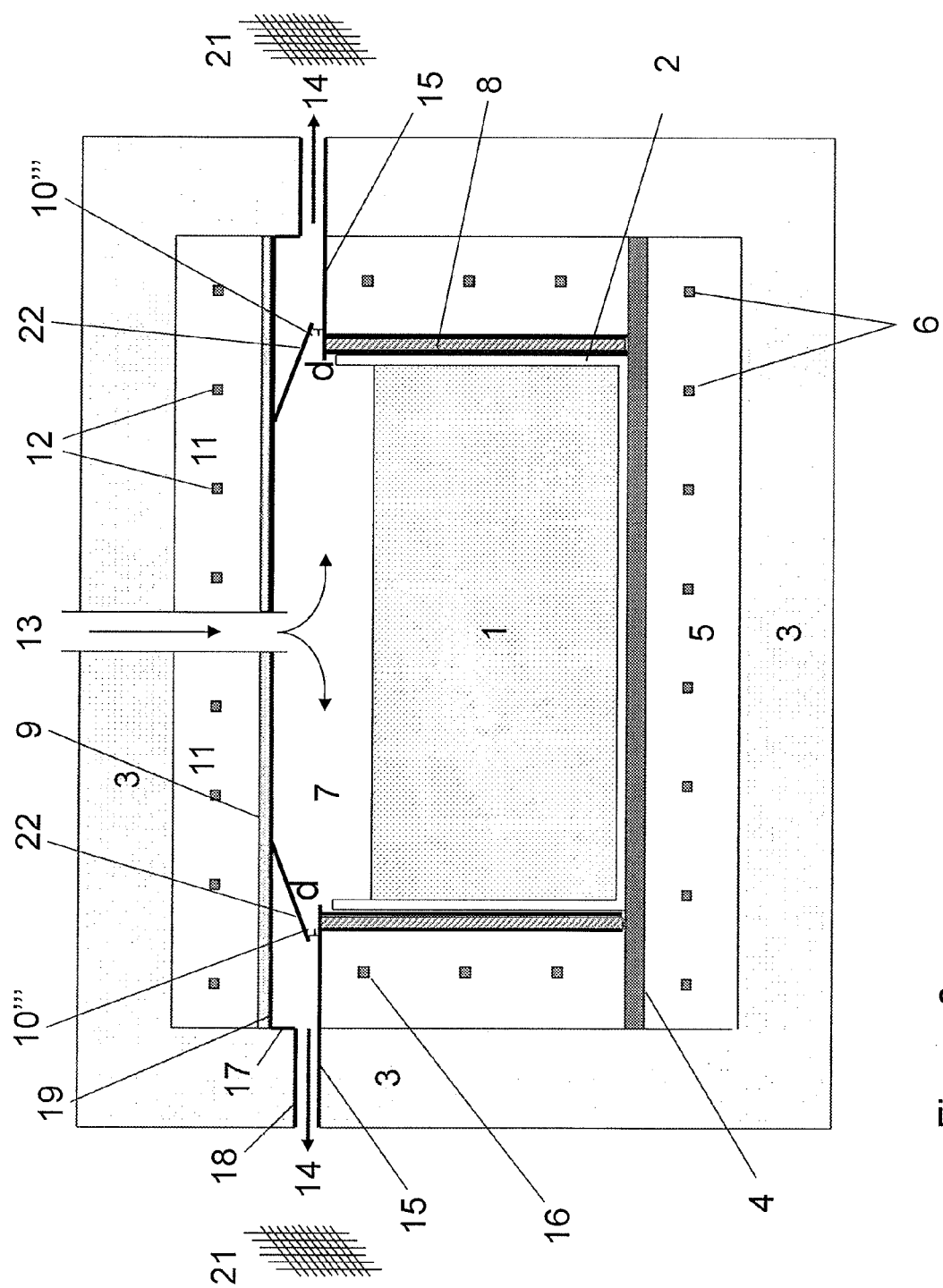
FIG. 6 is a schematic drawing of a cross-section seen from the side of a third example embodiment of the invention including a hood for extra protection of the melt.

The third example embodiment, shown schematically in FIG. 6, is similar to the second example embodiment above except that it also comprises a hood 20 made by joining four planar trapezoidal sheets of carbon fibre-reinforced carbon (CFRC) of thickness 1-2 mm and which is coated with 80-100 μm thick layer of SiC on both sides to form an "umbrella" resembling structure which is attached to and suspended from upper shield element 19. The thermal conductivity of the SiC-coated CFRC is about 25 W/mK at 1600° C.

The hood 22 is tapered outwardly forming a truncated pyramid suspended from the upper shield element 19 which is partly thread over the upper part of the crucible 2 to form an upper enclosure of the crucible extending from the upper shield element 19 to a small distance above the upper surface of the lower shield element 15. Thus the gas constrictions 10''' is formed by the distance d between the lower edge of the hood 22 and the upper surface of the lower shield element 15.

The purge gas will thus be forced to flow between the crucible 2 and the inner surface of the hood 22 towards the gap or opening that is being made between the hood and the upper surface of the lower shield element 15. The gap extends all way around the crucible without making contact between the hood and the crucible or the hood and the lower shield element 15 at any point. The minimum distance between the crucible wall and the hood is in the range from 35 to 70 mm.

Figure 7:
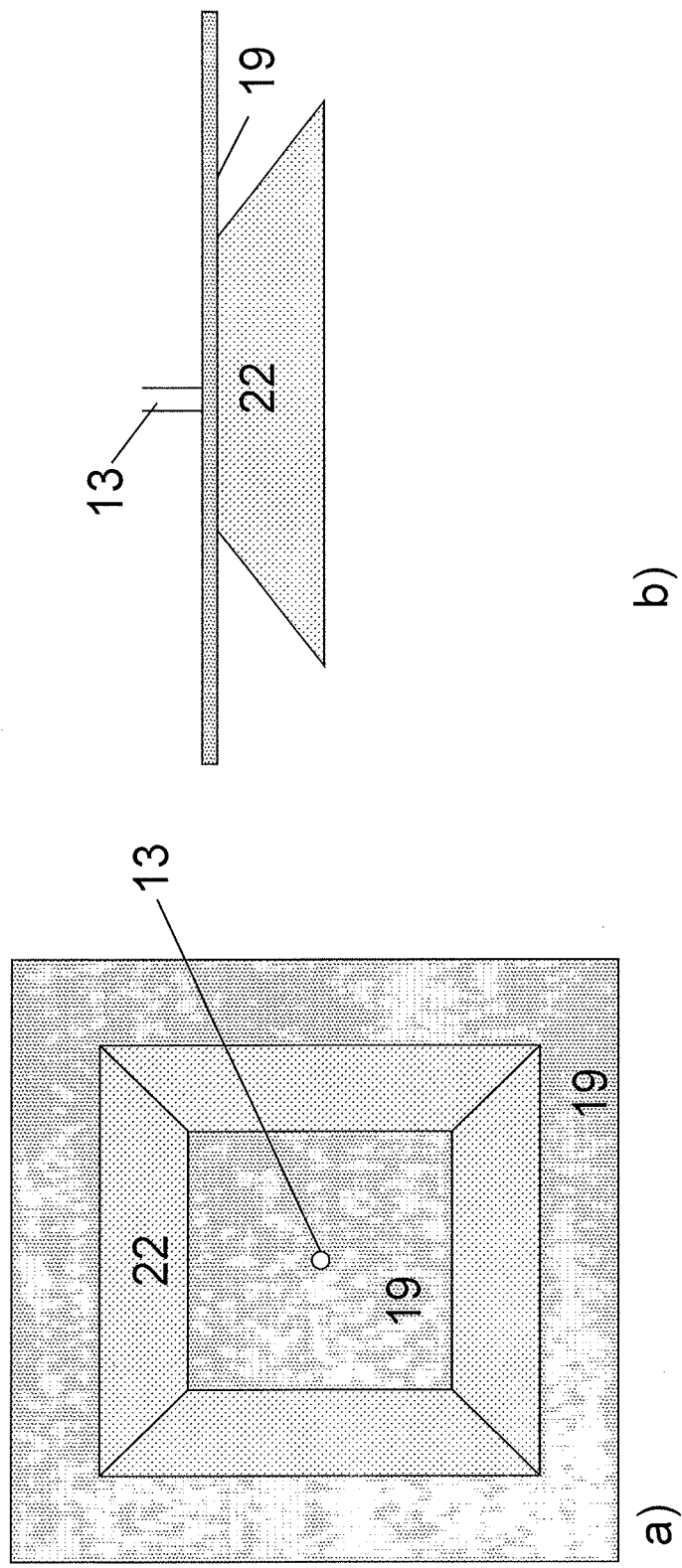

The hood 22 is schematically illustrated in FIG. 7, where FIG. 7 *a*) which is a view from below and 7 *b*) is a view from the side.

Another difference between the third embodiment and the first and second embodiment is that it includes a trap 21 for catching SiO-gas. The trap is a metal grid which cools the gas when passing through the grid to a temperature in the range of ca. 300-400° C. The first and second embodiments may also have a similar trap 21 for SiO-condensation as well.

Verification of the Invention

The Effect of the Invention on Silicon Ingots

A series of comparison experiments where silicon has been melted and solidified according to the Bridgeman method using a modified arrangement have been performed to verify the effect of shielding the melt from being exposed to the back-flowed or back-diffused gas.

The arrangement employed a hood as in the third example embodiment above, but the lower shielding element only stretched a part of the distance from the circumferential side support towards the inner surface of the heat insulating wall of the compartment. Thus, the comparison experiments did not evaluate the protective effect of the present invention on the carbonaceous structural parts of the furnace. There is reason to believe that contact was made between carbonaceous structural parts and SiO inside the hot environment of the compartment such that SiC and CO-gas was formed. The results of the comparison experiments should thus be expected to be on the lower side of what might be expected when applying a full protection of the hot compartment of the furnace and thus practically eliminating contact between hot SiO-gas and C.

Each experiment were conducted with exactly the same heating and solidifying procedure, same flow of the purge gas and pressure. The only difference between the tests was that one series of ingots was produced with the gas shield arrangement and the other series without the gas shield arrangement.

FIG. 8*a*) is a photograph of a multi-crystalline silicon ingot made with a gas shield according to the present invention, and FIG. 8*b*) without. As can be clearly seen on the photographs, the surface of the ingot in FIG. 8*b*) is considerably more dull and grey due to formation of SiC resulting from a reaction with CO that is transported to the melt inside the furnace chamber. This result is supported by measurements of CO concentration above the silicon melt at the beginning of the crystallization as a function of argon supply demonstrated on FIG. 9. The figure shows that CO-concentration above the melt is much efficiently reduced by lower amounts of purge gas in case of application of gas shield arrangement. The results obtained for ingots made without the gas shield is the black line with crosses, and the results for the ingots made with the gas shield according to the present invention is the grey line with full circles.

The carbon concentration of the produced ingots is also measured as a function of ingot height. The results shown on FIG. 10, are typical averages of SIMS analysis for carbon distribution for one of the 32 ingots. As can be seen from the FIG. 10, the ingots made with the gas shield according to the present invention has a carbon concentration of a factor 3 or more at ingot heights from 60% and below, and a carbon concentration of about 25% lower at the upper part of the ingot. The results obtained for ingots made without the gas shield is the grey line with circles, while the results for the ingots made with the gas shield of the present invention is the grey line with crosses.

The results shown on FIG. 11*a*) and *b*) demonstrate the level of sawing marks across the ingot height (accumulated for 512 wafer blocks cut from 32 ingots) indicating that the blocks being sawn out of the ingots made with the gas shield should contain much less SiC-inclusions which are known to cause wire-breaks and reduce wafer production output in the process of wire-sawing (wafering) of the blocks into wafers. One of the problems is that the wire when reaching hard SiC-inclusion produces sawing wire defects (sawing marks) causing rejection of the wafer for further downstream processing.

Finally, FIG. 12 is a diagram shows typical distribution of loss reduction (%) (achieved by application of gas shield arrangement according to the present invention) for each of 16 blocks cut from one ingot resulting in average reduction of wafer losses about 58% compared to the factory baseline without gas shield arrangement.

The Effect of the Invention on the Solar Cells

The effect of the invention on the downstream processing of the wafers to solar cells has been investigated as follows:

Crystallized silicon ingot is cooled down and cut vertically into 16 equivalent bricks of approximately 245 mm height. Then the square wafers are produced by slicing the bricks in horizontal direction into wafers of size 156 mm×156 mm and 200 μm thick. After slicing, the wafers are subsequently washed, dried and then go through the standard process of solar cell preparation: etching to texture the surface, chemical vapor deposition (CVD) of n-dopant (phosphorous), in-diffusion of phosphorous at elevated temperatures, deposition of anti-reflective coating of silicon nitride on a front surface of the wafer. Finally, the metallic electrical contacts are applied on a front and back sides of the wafer.

The solar cells produced from wafers went through the cell tester, where the wafers with different cell efficiencies, but having resistance below the threshold of 30 ohm are sorted out as "shunted" i.e. of inappropriate quality. As it could be seen from comparison of cell distribution shown on FIG. 13 (crystallization process without gas guiding device) and FIG. 14 (crystallization process with gas guiding device), the employment of gas guiding device reduces the fraction of shunted solar cells by a factor of 10 due to reduced precipitation of SiC particles.

The invention claimed is:

1. An arrangement for manufacturing crystalline silicon ingots by directional solidification, the arrangement comprising:
    at least one compartment with heat insulating side wall(s) configured to house a crucible, the at least one compartment comprising:
    a heating device;
    at least one inlet for supplying purge gas into the compartment;
    one or more outlet(s) for extracting gas from the compartment;
    a gas conduit formed by a continuous peripheral opening between:
        an upper shield element placed at a distance above the crucible and which covers the horizontal cross-section area of the compartment to separate it in two overlaid sub-compartments where the upper sub-compartment has heating means, and
        a lower shield element placed at a distance below the upper shield element and along the outer surface of the crucible, and which covers the cross-section area formed between the outer surface of the crucible and the inner surface of the side heat insulating wall(s) of the compartment; and
    a flow constriction located in the gas conduit or the one or more outlet(s), providing a cross-section area, A, in the gas conduit or one or more outlet(s), equal to A=P·d, where P is a perimeter length of an upper edge of the crucible in mm and d is between 0.5 and 50 mm,
    wherein the one or more inlet(s) for supplying purge gas is (are) located above the crucible, and located on the heat insulating side wall(s) of the compartment between the upper and lower shield elements.

2. Arrangement according to claim 1, wherein d is between 2 and 10 mm.

3. Arrangement according to claim 1, wherein
    the upper shield element is made of one plate or sheet forming a substantially horizontally oriented partition wall or ceiling, and
    the lower shield element is made of one plate or sheet element forming a substantially horizontally oriented partition wall or platform projecting from the outer surface of the crucible wall along the entire periphery of the crucible and thus separating the inner space of the compartment into two over-laid sub-compartments along the periphery of the compartment.

4. Arrangement according to claim 3, wherein the lower and upper shield elements are each made of one rigid plate or a flexible sheet of a material able to withstand the temperatures and chemical environment found in silicon crystallisation furnaces formed by one continuous structural element, or they are made of more than one rigid plate or flexible sheet elements which together covers the intended cross-sectional area of the inner space of the compartment.

5. Arrangement according to claim 4, wherein the sheets are made of one of the following materials: carbon fibre-reinforced silicon carbide such as C—C/SiC or C/SiC-composites, silicon carbide fibre composite SiC/SiC, carbon fibre-reinforced carbon with or without a SiC-coating, or graphite coated or uncoated with SiC.

6. Arrangement according to claim 5, wherein the sheets are carbon fibre-reinforced carbon coated with SiC, wherein
    the thickness of the carbon fibre-reinforced carbon sheets is in the range of 1-10 mm, and
    the thickness of the SiC-coating is in the range of 10-200 μm.

7. Arrangement according to claim 6, wherein
    a thickness of the carbon fibre-reinforced carbon sheets is in a range of 2-8 mm, and
    a thickness of the SiC-coating is in a range of 20-150 μm.

8. Arrangement according to claim 3, wherein the flow constriction is formed by the gap or distance between the upper edge of the crucible and the upper shield element of the gas guide forming a continuous slot between them with a cross-sectional area, A, of A=P·d, where P is the perimeter length of the upper edge of the crucible in mm and d is between 2 and 50 mm.

9. Arrangement according to claim 3, wherein the flow constriction is formed by the gap or distance between the upper edge of a circumferential side support and the and the upper shield element of the gas guide forming a continuous slot between them with a cross-sectional area, A, of A=P·d, where P is the perimeter length of the upper edge of the crucible in mm and d is between 2 and 50 mm, and where the lower shield element is placed along the outer surface of the circumferential side support and covers the cross-section area formed between the outer surface of the circumferential side support and the inner surface of the side heat insulating wall(s) of the compartment.

10. Arrangement according to claim 3, wherein the flow constriction is formed by applying a circumferential hood attached to and extending downward from the upper shield element to a distance above the lower shield element forming a continuous slot along the periphery of the circumferential hood at a distance from the crucible wall, and where the slot has a cross-sectional area, A, of A=P·d, where P is the perimeter length of the upper edge of the crucible in mm and d is between 2 and 50 mm.

11. Arrangement according to claim 3, wherein the flow constriction is formed by the gas outlet by having a gas outlet with a cross-sectional area, A, of A=P·d, where P is the perimeter length of the upper edge of the crucible in mm and d is between 2 and 50 mm.

12. Arrangement according to claim 9, wherein the circumferential side support is made of plate elements of one of the following materials: carbon fibre-reinforced silicon carbide ceramics such as C—C/SiC or C/SiC-composites, silicon carbide fibre composite SiC/SiC, carbon fibre-reinforced carbon CFRC with or without a SiC-coating, or graphite coated or uncoated with SiC, or a combination thereof.

13. Arrangement according to claim 1, wherein the protection of the surface of the heat insulating wall between the upper and lower shield element is obtained by covering the surface with a material which is able to withstand the heat and chemical environment in the compartment.

14. Arrangement according to claim 13, wherein the covering material is plate elements of one of the following materials: carbon fibre-reinforced silicon carbide ceramics such as C—C/SiC or C/SiC-composites, silicon carbide fibre composite SiC/SiC, carbon fibre-reinforced carbon CFRC with or without a SiC-coating, or graphite coated or uncoated with SiC, or a combination thereof.

15. Arrangement according to claim 13, wherein the covering material is of the same material and made an integral part of the upper and lower shield element, respectively.

16. Arrangement according to claim 3, wherein the arrangement also comprises a condensation trap placed at the outlet for extracting gas from the compartment in the form of a cold mesh or grid made of metal.

17. Arrangement according to claim 2, wherein
the upper shield element is made of one plate or sheet forming a substantially horizontally oriented partition wall or ceiling, and
the lower shield element is made of one plate or sheet element forming a substantially horizontally oriented partition wall or platform projecting from the outer surface of the crucible wall along the entire periphery of the crucible and thus separating the inner space of the compartment into two over-laid sub-compartments along the periphery of the compartment.

18. Arrangement according to claim 4, wherein the flow constriction is formed by the gap or distance between the upper edge of the crucible and the upper shield element of the gas guide forming a continuous slot between them with a cross-sectional area, A, of A=P·d, where P is the perimeter length of the upper edge of the crucible in mm and d is between 2 and 50 mm.

19. Arrangement according to claim 5, wherein the flow constriction is formed by the gap or distance between the upper edge of the crucible and the upper shield element of the gas guide forming a continuous slot between them with a cross-sectional area, A, of A=P·d, where P is the perimeter length of the upper edge of the crucible in mm and d is between 2 and 50 mm.

20. Arrangement according to claim 6, wherein the flow constriction is formed by the gap or distance between the upper edge of the crucible and the upper shield element of the gas guide forming a continuous slot between them with a cross-sectional area, A, of A=P·d, where P is the perimeter length of the upper edge of the crucible in mm and d is between 2 and 50 mm.

21. Arrangement according to claim 1, wherein d is between 4 and 6 mm.

22. Arrangement according to claim 6, wherein
the thickness of the carbon fiber-reinforced carbon sheets is in the range of 2-5 mm, and
the thickness of the SiC-coating is in the range of 40-120 µm.

23. Arrangement according to claim 6, wherein
the thickness of the carbon fiber-reinforced carbon sheets is in the range of 2-3 mm, and
the thickness of the SiC-coating is in the range of 60-100 µm.

* * * * *